United States Patent [19]

DiBene

[11] Patent Number: 5,785,449
[45] Date of Patent: Jul. 28, 1998

[54] HIGH PRESSURE JACKSCREW CONNECTOR

[75] Inventor: Joseph T. DiBene, Oceanside, Calif.

[73] Assignee: NCR Corporation, Dayton, Ohio

[21] Appl. No.: 680,422

[22] Filed: Jul. 15, 1996

Related U.S. Application Data

[63] Continuation of Ser. No. 173,811, Dec. 22, 1993, abandoned.

[51] Int. Cl.[6] .................................................. F16B 39/00
[52] U.S. Cl. ........................ 403/343; 411/105; 411/107; 411/965
[58] Field of Search ..................... 403/343; 411/103, 411/105, 107, 402, 965; 361/724, 726, 759, 796, 798, 801

[56] References Cited

U.S. PATENT DOCUMENTS

| | | |
|---|---|---|
| 1,911,820 | 5/1933 | Fitzgerald . |
| 2,344,102 | 3/1944 | Meisterhans . |
| 2,835,615 | 9/1958 | King, Jr. . |
| 3,059,736 | 10/1962 | Boyd .................................. 411/965 X |
| 3,252,493 | 5/1966 | Smith . |
| 3,640,327 | 2/1972 | Burt . |
| 4,387,497 | 6/1983 | Gulistan ............................. 411/105 X |
| 4,396,327 | 8/1983 | Menke ................................. 411/337 |
| 4,616,967 | 10/1986 | Molina ............................... 411/105 |
| 4,863,326 | 9/1989 | Vickers .............................. 411/105 |
| 4,915,557 | 4/1990 | Stafford ............................. 411/107 |
| 5,094,579 | 3/1992 | Johnson ............................. 411/107 |

*Primary Examiner*—Anthony Knight
*Attorney, Agent, or Firm*—Craig E. Miller; James M. Stover

[57] ABSTRACT

High pressure jackscrew connectors for removably attaching a first component to a second component having an internally threaded member. One preferred embodiment described includes a panel mount member which is attached to the first component to be joined. When attached to the first component, the panel mount member retains an internally threaded ejector member. A pressure inserter member having a longitudinally extending externally threaded portion engages with the internal threads of the ejector member and the internal threaded member of the second component to pull the ejector member towards the pressure inserter member and push the first component towards the second component upon rotation of the pressure inserter member. These high pressure jackscrew connectors are suitable for use in removably attaching printed circuit boards, particularly those utilizing high-density connectors which generally require greater insertion and extraction forces, and other components in and to electrical apparatus enclosures, chassis and other structural members.

21 Claims, 4 Drawing Sheets

HIGH PRESSURE JACKSCREW CONNECTOR

This is a continuation of application Ser. No. 08/173,811, filed on Dec. 22, 1993 now abandoned.

BACKGROUND AND SUMMARY OF THE INVENTION

The present invention relates generally to new and novel improvements in high pressure jackscrew connectors. More particularly, the present invention relates to high pressure jackscrew connectors which are suitable for use in removably attaching printed circuit boards and other components, particularly those utilizing high-density connectors which generally require greater insertion and extraction forces, in and to electrical apparatus enclosures, chassis and other structural members.

High pressure jackscrew connectors have been widely used to removably attach printed circuit boards and other components in and to electrical apparatus enclosures, chassis and other structural members. In general, conventional high pressure jackscrew connectors have performed this task reasonably well. However, with the development of printed circuit boards having components utilizing high-density connectors, the force necessary to insert and extract the printed circuits boards can cause separation and failure of conventional high pressure jackscrew connectors.

Thus, one problem which has been experienced with many conventional high pressure jackscrew connectors is that they tend to separate or break when exposed to high forces, for example forces such as those exerted upon connector systems used to removably attach printed circuit boards and other components to electrical enclosures, chassis and other structural members. This problem becomes particularly acute in the case of printed circuit boards having components utilizing high-density connectors which often require large insertion and extraction forces. Conventional high pressure jackscrew connectors used in such applications have encountered numerous problems including the formation of loose metal shavings from wear, mechanical failure of the threaded screw element during insertion and extraction of the printed circuit board or other components, and the threaded screw element being pulled out of the high pressure jackscrew connector.

A second problem which has been experienced with many conventional high pressure jackscrew connectors is that they are somewhat intolerant of out of alignment conditions which are sometimes present between components being assembled. Such out of alignment conditions are generally caused by manufacturing tolerances and other inherent manufacturing process variations. The need to maintain alignment of the components being assembled within rather narrow limits as required by many conventional high pressure jackscrew connectors can increase the cost of components, limit the interchangeablity of components and cause otherwise acceptable components to be reworked or scrapped.

Accordingly, an object of the present invention is the provision of high pressure jackscrew connectors capable of withstanding greater mechanical forces, such as those present during insertion and extraction of printed circuit boards, in particular those having high-density electrical connectors, and other components to and from electrical enclosures, chassis and other structural members.

Another object of the present invention is to provide high pressure jackscrew connectors capable of removably assembling components with greater misalignment than that which can be accommodated by many conventional high pressure jackscrew connectors.

These and other objects of the present invention are attained by the provision of high pressure jackscrew connectors for removably attaching a first component to a second component having an internally threaded member. The high pressure jackscrew connectors generally consist of a panel mount member which is attached to the first component to be joined. When attached to the first component, the panel mount member retains an internally threaded ejector member. A pressure inserter member having a longitudinally extending externally threaded portion engages with the internal threads of the ejector member and the internal threaded member of the second component to pull the ejector member towards the pressure inserter member and push the first component towards the second component upon rotation of the pressure inserter member. These high pressure jackscrew connectors are suitable for use in removably attaching printed circuit boards, particularly those utilizing high-density connectors which generally require greater insertion and extraction forces, and other components to electrical apparatus enclosures, chassis and other structural members.

Other objects, advantages and novel features of the present invention will become apparent in the following detailed description of the invention when considered in conjunction with the accompanying drawings.

DETAILED DESCRIPTION OF THE DRAWINGS

Figure 1:
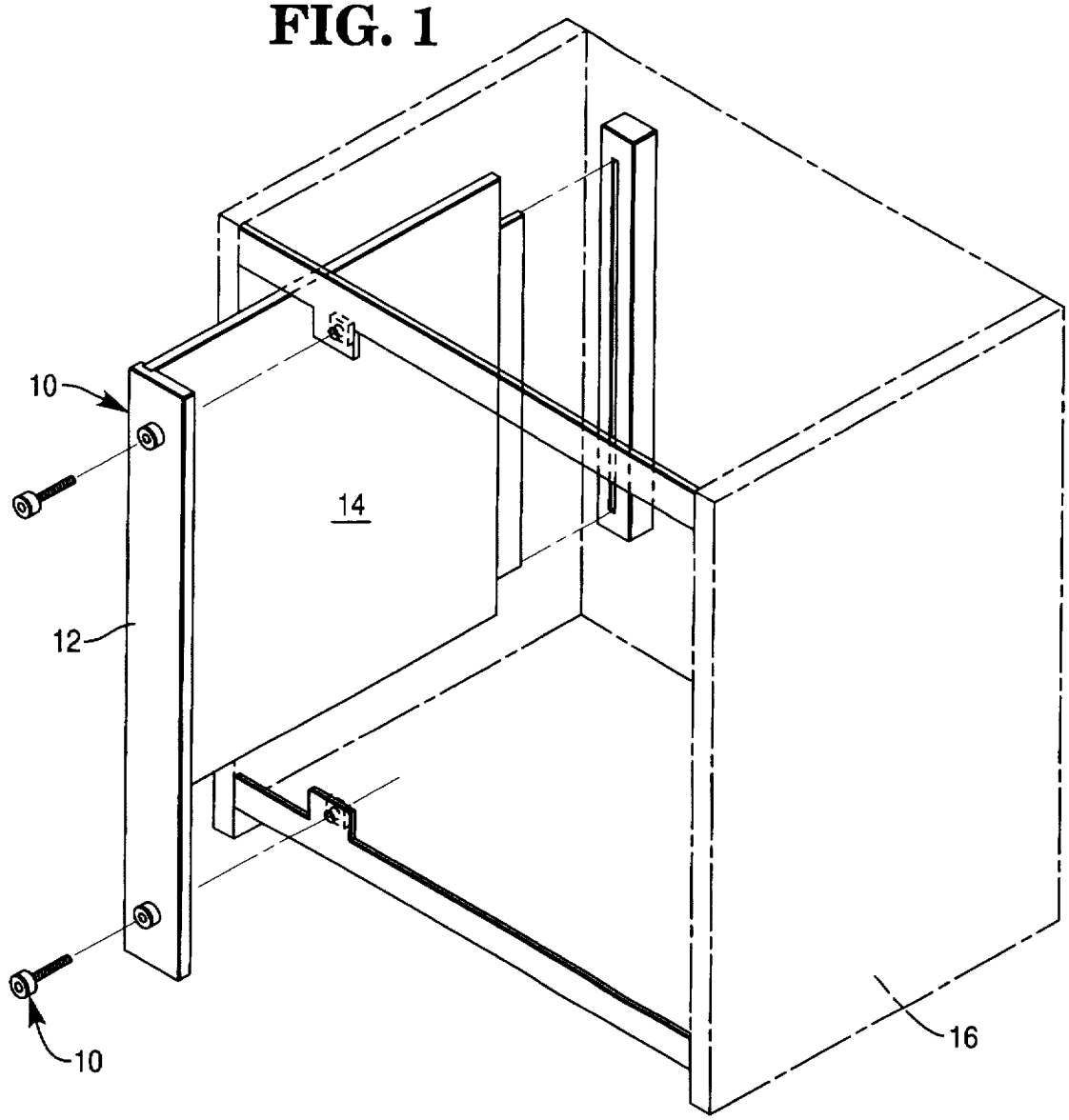
FIG. 1 is an exploded perspective view of a typical electrical apparatus chassis with the front panel of a printed circuit board being removably assembled to the electrical apparatus chassis using two high pressure jackscrew connectors in accordance with the present invention.

Referring now to the drawings, in which like-referenced characters indicate corresponding elements throughout the several views, attention is first drawn to FIG. 1, which illustrates a typical electrical apparatus utilizing a high pressure jackscrew connector in accordance with the present invention, generally identified as reference numeral 10. In this figure, two high pressure jackscrew connectors 10 removably attach front panel 12 of printed circuit board 14 to a typical electrical apparatus chassis 16.

Figure 2:
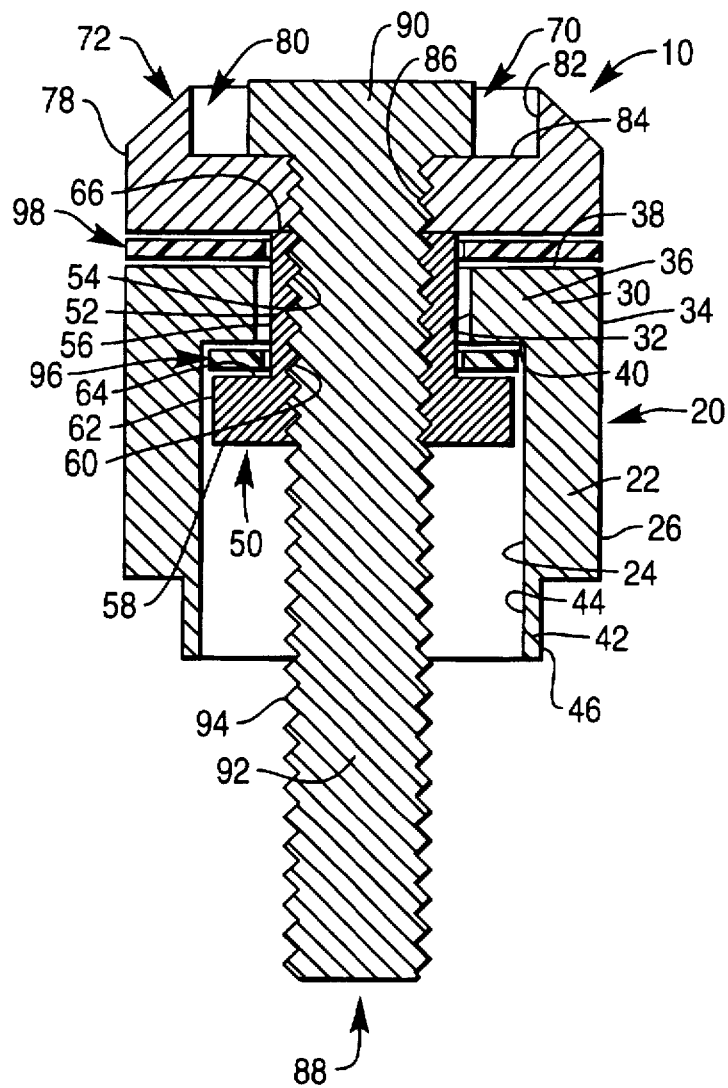
FIG. 2 is a cross-sectional side view of a first embodiment of a high pressure jackscrew connector in accordance with the present invention.

Referring now to FIG. 2, the mechanical structure of a first preferred embodiment of high pressure jackscrew connector 10 will be described. High pressure jackscrew connector 10 includes panel mount member 20, ejector member 50, pressure inserter member 70 and, if desired, inner washer 96 and outer washer 98. Panel mount member 20 is a generally cylindrical member and includes first cylindrical section 22 having inside diameter 24 and outside diameter 26. First cylindrical section 22 transitions into second inwardly extending cylindrical portion 30 having inside diameter 32 and outside diameter 34. Outside diameter 26 of first cylindrical section and outside diameter 34 of second inwardly extending cylindrical section 30 are preferably approximately the same. However, inside diameter 24 of first cylindrical section 22 is preferably greater than inside diameter 32 of second inwardly extending cylindrical section 30, forming inwardly extending portion 36. Inwardly extending portion 36 includes top surface 38 and bottom surface 40. Swage portion 42 extends downwardly from first cylindrical section 22 and includes inside diameter 44 and outside diameter 46. Inside diameter 44 of swage portion 42 is preferably approximately the same as inside diameter 24 of first cylindrical section 22. Outside diameter 46 of swage portion 42 is preferably smaller than outside diameter 26 of first cylindrical section 22, thus resulting in a reduced wall thickness in swage portion 42. Swage portion 42 permits swaging or attachment of panel mount member 20 to an opening in front panel 12 of printed circuit board 14 as will be described in more detail later in this specification.

Ejector member 50 is a generally cylindrical component which is retained within panel mount member 20. In particular, ejector member 50 includes first cylindrical section 52 having inside diameter 54 and outside diameter 56. Outside diameter 56 of ejector member 50 is preferably smaller than inside diameter 24 of first cylindrical section 22 of panel mount member 20 to permit sliding of ejector member 50 in relation to panel mount member 20. First Cylindrical section 52 transitions into second outwardly extending cylindrical section 58, second outwardly extending cylindrical section 58 having inside diameter 60 and outside diameter 62. Inside diameter 60 of second outwardly extending cylindrical section 58 is preferably approximately the same as inside diameter 54 of first cylindrical section 52. Outside diameter 62 of second outwardly extending cylindrical section 58 is preferably greater than inside diameter 32 of second inwardly extending cylindrical section 30 of panel mount member 20 such that top surface 64 of second outwardly extending cylindrical section 58 contacts bottom surface 40 of inwardly extending portion 36 of panel mount member 20 to prevent upward removal of ejector member 50 from panel mount member 20.

Pressure inserter member 70 is also a generally cylindrical member and includes head member 72 and longitudinally extending externally threaded member 88. Outside diameter 78 of head member 72 is preferably approximately the same as outside diameter 26 of first cylindrical section 22 of panel mount member 20.

Longitudinally extending externally threaded member 88 includes head portion 90 and longitudinally extending externally threaded portion 92 projecting downwardly therefrom. Head portion 90 preferably includes a hex or some other rotation driving configuration to cause rotation of longitudinally extending externally threaded member 88 as will be described in more detail later in this specification. In addition, the surface of outside diameter 78 of head member 72 is preferably knurled to allow pressure inserter member 70 to be rotated by hand, if desired. Longitudinally extending externally threaded portion 92 extends through aperture 86 in head member 72 and is preferably press fit or staked to cause head member 72 and longitudinally extending externally threaded member 88 to rotate as an integral assembly. It will be recognized by those with ordinary skill in the relevant art that knurled head 72 and longitudinally extending externally threaded member 88 could alternatively be fabricated as a single integral piece.

The top surface of head member 72 preferably includes recess portion 80 including inside diameter 82 and bottom surface 84. Inside diameter 82 of recess portion 80 is preferably greater than head portion 90 of longitudinally extending externally threaded member 88. Thus, head portion 90 of longitudinally extending externally threaded member 88 is retained within and rests on bottom surface 84 of recess portion 80 and is approximately flush with the top surface of head member 72.

The threads present on outside diameter 94 of longitudinally extending externally threaded portion 92 preferably engage with corresponding internal threads present on inside diameter 54 of first cylindrical section 52 and inside diameter 60 of second outwardly extending cylindrical section 58 of ejector member 50. Thus, upon engagement of longitudinally extending externally threaded portion 92, ejector member 50 will be pulled upwardly until top surface 66 of first cylindrical section 52 of ejector member 50 contacts the bottom surface of head member 72.

If desired, inner washer 96, preferably fabricated from nylon, can be positioned between top surface 64 of second outwardly extending cylindrical section 58 of ejector member 50 and bottom surface 40 of inwardly extending portion 36 of panel mount member 20. Similarly, outer washer 98, preferably fabricated from nylon, is positioned between top surface of second inwardly extending cylindrical section 30 of panel mount member 20 and the bottom surface of head member 72 of pressure inserter member 70.

Figure 3:
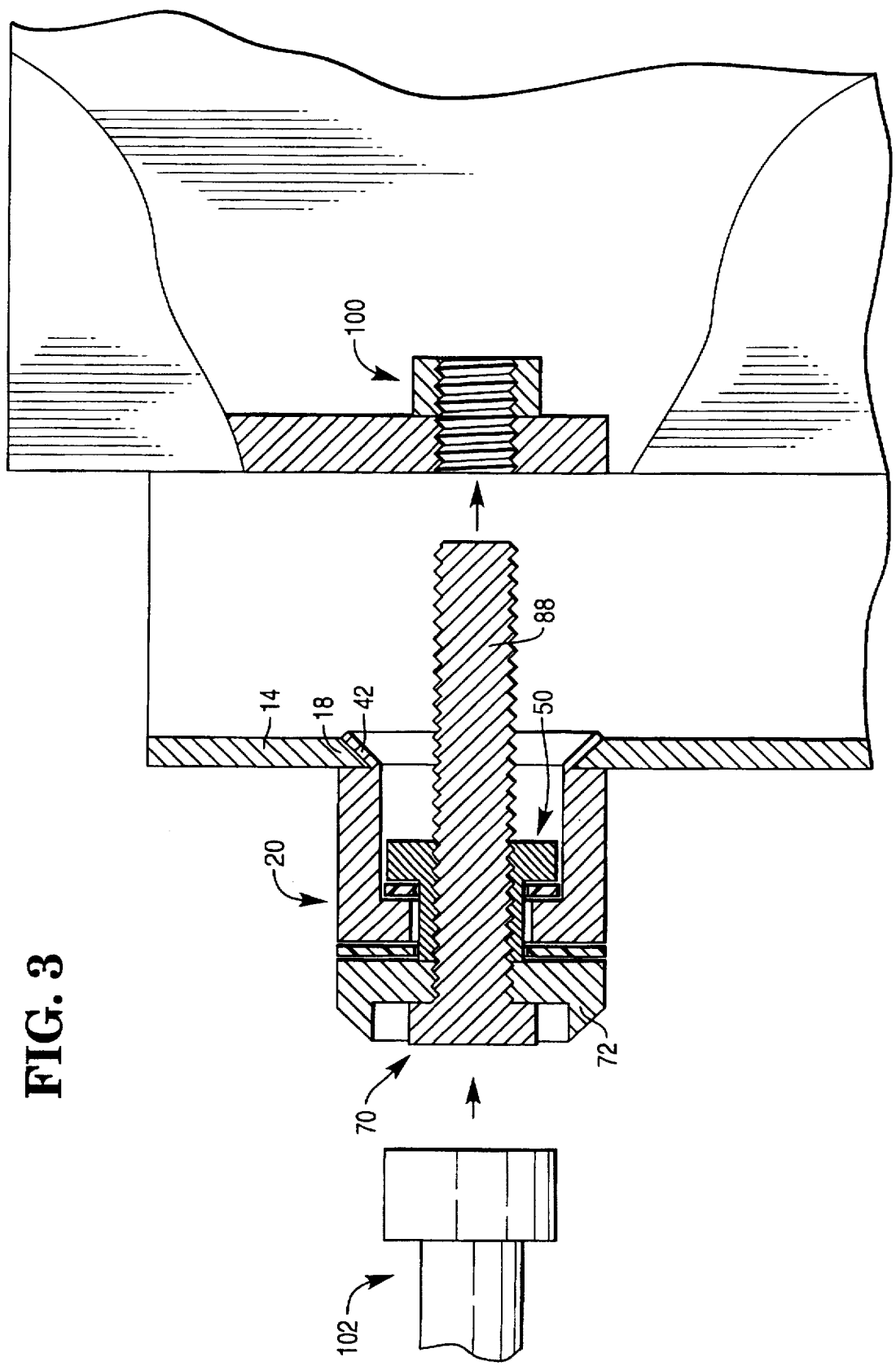
FIG. 3 is a cross-sectional side view of the high pressure jackscrew connector shown in FIG. 2 being installed to removably attach the front panel of the printed circuit board to the electrical apparatus chassis.

Referring now to FIG. 3, the method of removably attaching front panel 12 of printed circuit board 14 to electrical apparatus chassis 16 using high pressure jackscrew connector 10 will be described. First, angled opening 18 is formed in front panel 12 of printed circuit board 14 having a diameter slightly larger than outside diameter 46 of swage portion 42 of panel mount member 20. Then, ejector member 50 is inserted inside panel mount member 20 and swage portion 42 of panel mount member 20 is inserted into angled opening 18. At this time, swage portion 42 is deformed outwardly, thus retaining panel mount member 20 to angled opening 18 in front panel 12 of printed circuit board 14.

To removably attach front panel 12 of printed circuit board 14 to electrical chassis 16, panel mount member 20 mounted onto front panel 12 as described above is aligned with weldnut 100. Pressure inserter member 70 is then inserted into panel mount member 20 and external threads present on outside diameter 94 of longitudinally extending externally threaded portion 92 engage with corresponding internal threads on inside diameter 54 of first cylindrical section 52 and inside diameter 60 of second outwardly extending cylindrical section 58 of ejector member 50 and weldnut 100. Pressure inserter member 70 is then rotated by hand on knurled outside diameter 78 of head member or by engaging the hex or other driving configuration present on head portion 90 with rotation driver tool 102. During insertion, preferably turning pressure inserter member 70 clockwise, pressure inserter member 70 applies pressure against panel mount member 20 to force printed circuit board 14 away into, for example, a connector mounted on a back panel of electrical apparatus chassis 16. During extraction, preferably turning pressure inserter member 70 counter-clockwise, ejector member 50 applies pressure against the bottom surface of pressure inserter member 70 to assist in pulling printing circuit board 14 out of and away from the connector mounted on the back panel of electrical apparatus chassis 16. If two or more high pressure jackscrew connectors 10 are used to removably attach front panel 12 of printed circuit board 14 to electrical apparatus chassis 16, high pressure jackscrew connectors 10 should be alternatively turned during both the insertion and extraction procedure.

Figure 4:
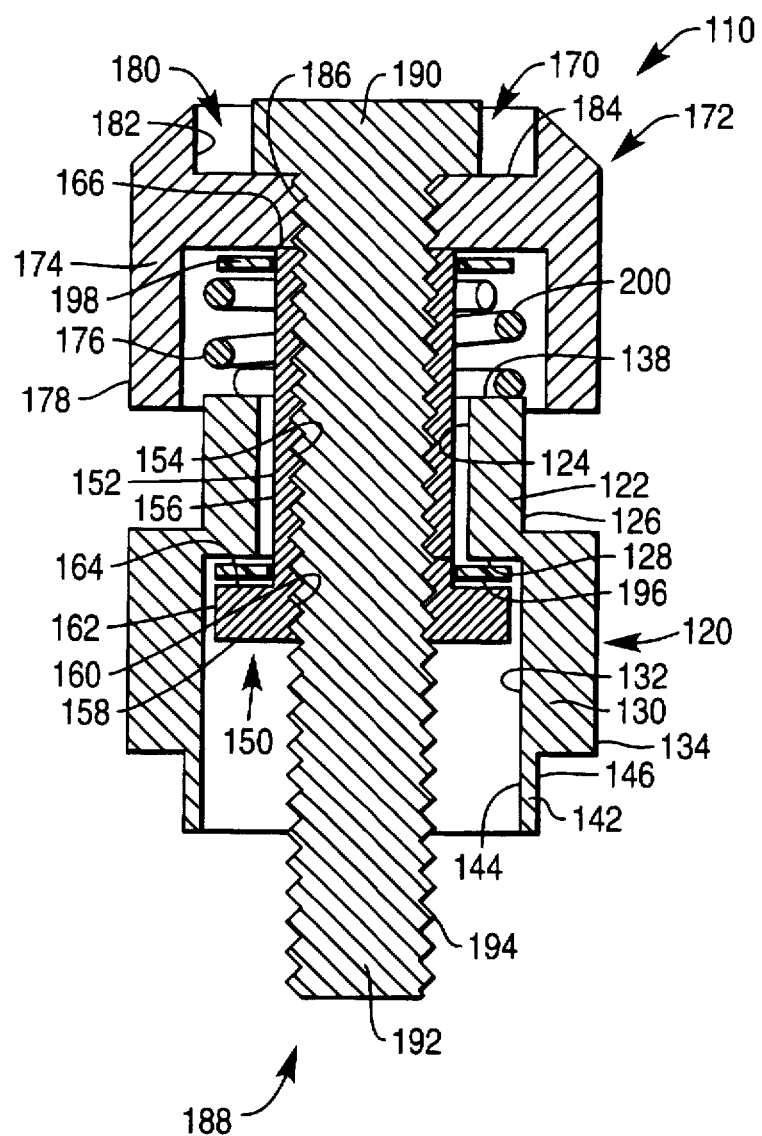
FIG. 4 is a cross-sectional side view of a second embodiment of a high pressure jackscrew connector in accordance with the present invention.

Referring now to FIG. 4, the mechanical structure of a second preferred embodiment of high pressure jackscrew connector, generally identified by reference numeral 110, will be described. High pressure jackscrew connector 110 includes panel mount member 120, ejector member 150, pressure inserter member 170, spring 200 and, if desired, inner washer 196 and outer washer 198. Panel mount member 120 is a generally cylindrical member and includes first cylindrical section 122 having inside diameter 124 and outside diameter 126. First cylindrical section 122 transitions through shoulder 128 to second cylindrical section 130 having inside diameter 132 and outside diameter 134. The wall thickness of first cylindrical section 122 and second cylindrical section 130 are preferably approximately the same and inside diameter 124 and outside diameter 126 of first cylindrical section 122 are preferably less than inside diameter 132 and outside diameter 134 of second cylindrical section 130.

Swage portion 142 extends downwardly from first cylindrical section 122 and has inside diameter 144 and outside diameter 146. Inside diameter 144 is preferably approximately the same as inside diameter 132 of second cylindrical portion 130 and outside diameter 146 is preferably smaller than outside diameter 134 of second cylindrical portion 130, thus resulting in a reduced wall thickness in swage portion 142. Swage portion 142 permits swaging or attachment of panel mount 120 to an opening in front panel 12 of printed circuit board 14 as described previously in this specification in connection with the discussion concerning FIG. 3.

Ejector member 150 is a generally cylindrical component with is retained within panel mount member 120. In particular, ejector member 150 includes first cylindrical section 152 having inside diameter 154 and outside diameter 156. Outside diameter 156 of ejector member 150 is preferably smaller than inside diameter 124 of first cylindrical section 122 of panel mount member 120 to permit sliding of ejector member 150 in relation to panel mount member 120. First cylindrical section 152 transitions into second outwardly extending cylindrical section 158, second outwardly extending cylindrical section 158 having inside diameter 160 and outside diameter 162. Inside diameter 160 of second outwardly extending cylindrical section 158 is preferably approximately the same as inside diameter 154 of first cylindrical section 152. Outside diameter 162 of second outwardly extending cylindrical section 158 is preferably both greater than outside diameter 156 of first cylindrical section 152 and less than inside diameter 132 of second cylindrical section 130 of panel mount member 120 such that top surface 164 of ejector member 150 contacts shoulder 128 of panel mount member 120 to prohibit upward removal of ejector member 150 from panel mount member 120.

Pressure inserter 170 generally includes head member 172 and longitudinally extending externally threaded member 188. Head member 172 includes downwardly extending portion 174 having inside diameter 176 and outside diameter 178. Outside diameter 178 of head member 172 is preferably approximately the same as outside diameter 134 of second cylindrical section 130 of panel mount member 120. Inside diameter 176 is preferably greater than outside diameter 126 of first cylindrical section 122 of panel mount member 120 to allow a sliding relationship between panel mount member 120 and pressure inserter member 170.

Longitudinally extending externally threaded member 188 includes head portion 190 and longitudinally extending externally threaded portion 192 projecting downwardly therefrom. Head portion 190 preferably includes a hex or some other driving configuration to cause rotation of longitudinally extending externally threaded member 188 as described in more detail in this specification in connection with the discussion concerning FIG. 3. In addition, the surface of outside diameter 178 of head member 172 is preferably knurled to allow pressure inserter member 170 to be rotated by hand, if desired. Longitudinally extending externally threaded member 188 extends through aperture 186 in head member 172 and is preferably press fit or staked to cause head member 172 and longitudinally extending externally threaded member 188 to rotate as an integral assembly. It will be recognized by those with ordinary skill in the relevant art that head member 172 and longitudinally extending externally threaded member 188 could alternatively be fabricated as a single integral piece.

The top surface of head member 172 preferably includes recess portion 180 which is greater in diameter than head portion 190 of longitudinally extending externally threaded member 188. Thus, head portion 190 of longitudinally extending externally threaded member 188 is retained within and is approximately flush with the top surface of head member 172.

The threads present on outside diameter 194 of longitudinally extending externally threaded portion 192 preferably engage with corresponding internal threads present on inside diameter 154 of first cylindrical section 152 and inside diameter 160 of second outwardly extending cylindrical section 158 of ejector member 150. Thus, upon engagement of longitudinally extending externally threaded portion 192, ejector member 150 will be pulled upwardly until top surface 166 of first cylindrical section 152 of ejector member 150 contacts the bottom surface of head member 172.

Compression spring 200 is positioned between the bottom surface of head member 172 of pressure inserter 170 and top surface 138 of first cylindrical section 122 of panel mount member 120. Thus, when compressed, compression spring 200 exerts a downward force upon panel mount member 120 and an upward force upon head member 172. If desired, inner washer 196, preferably fabricated from nylon, is positioned between top surface 164 of second outwardly extending cylindrical section 158 of ejector member 150 and shoulder 128 of panel mount member 120. Similarly, outer washer 198, preferably fabricated from nylon, is positioned between the bottom surface of compression spring 200 and top surface 138 of first cylindrical section 122 of panel mount member 120.

Although the present invention has been described above in detail, the same is by way of illustration and example only and is not to be taken as a limitation on the present invention. For example, although the use of swage portions 42 and 142 have been described to mount panel mount members 20 and 120 to front panel 12 of printed circuit board 14, other methods, such as rivets, solder, and mechanical attachment, could be readily accomplished utilizing the teachings of the present invention. Accordingly, the scope and content of the present invention are to be defined only by the terms of the appended claims.

What is claimed is:

1. A high pressure jackscrew connector for removably attaching a first component to a second component having an internally threaded member, said high pressure jackscrew connector comprising:

a panel mount member having a longitudinal opening, an inwardly projecting portion within said longitudinal opening, and means for attaching said panel mount member to the first component;

an ejector member retained within said longitudinal opening of said panel mount member, said ejector member having an internally threaded longitudinal opening and an outwardly extending portion which extends beyond said inwardly projecting portion of said panel mount member, thereby prohibiting removal of said ejector member from said panel mount member once said panel mount member is attached to the first component; and a pressure inserter member having a head member and a longitudinally extending externally threaded member, said longitudinally extending externally threaded member being contained within said longitudinal opening of said panel mount member in a coaxial relationship therewith and having a length greater than the length of said longitudinal opening of said panel mount member said longitudinally extending externally threaded member being in fixed engagement with said internally threaded longitudinal opening of said ejector member, said longitudinally extending externally threaded member further engaging with the internally threaded member of the second component;

whereby rotation of said pressure inserter member in a first direction will draw said longitudinally extending externally threaded member into said internally threaded member of the second component and cause said head portion to push the first component towards the second component; and whereby rotation of said pressure inserter member in a second direction will withdraw said longitudinally extending externally threaded member from said internally threaded member of the second component and cause said ejector portion to push the first component away from the second component.

2. The high pressure jackscrew connector in accordance with claim 1, wherein said means for attaching said panel mount member to the first component is a swage flange.

3. The high pressure jackscrew connector in accordance with claim 1, wherein said head member of said pressure inserter member has a knurled outer diameter to facilitate rotation of said pressure inserter member by hand.

4. The high pressure jackscrew connector in accordance with claim 1, wherein said head portion of said pressure inserter member has a rotation drive configuration to facilitate rotation of said pressure inserter member by a drive tool.

5. The high pressure jackscrew connector in accordance with claim 1, further including an inner washer positioned between said inwardly extending portion of said panel mount member and said outwardly extending portion of said ejector member.

6. The high pressure jackscrew connector in accordance with claim 5, wherein said inner washer is fabricated from nylon.

7. The high pressure jackscrew connector in accordance with claim 1, further including an outer washer positioned between said inwardly projecting portion of said panel mount member and said head member of said pressure inserter member.

8. The high pressure jackscrew connector in accordance with claim 7, wherein said outer washer is fabricated from nylon.

9. A high pressure jackscrew connector for removably attaching a first component to a second component having an internally threaded member, said high pressure jackscrew connector comprising:

a panel mount member having a first portion, a second portion and a longitudinal opening, said first portion having a smaller diameter than said second portion and said second portion having means for attaching said panel mount member to the first component;

an ejector member retained within said longitudinal opening of said panel mount member, said ejector member having an internally threaded longitudinal opening and an outwardly extending portion which extends radially beyond said smaller diameter of said first portion of said panel mount member, thereby prohibiting removal of said ejector member from said panel mount member once said panel mount member is attached to the first component;

a pressure inserter member having a head member and a longitudinally extending externally threaded member, said longitudinally extending externally threaded member being contained within said longitudinal opening of said panel mount member in a coaxial relationship therewith and having a length greater than the length of said longitudinal opening of said panel mount member, said longitudinally extending externally threaded member being in fixed engagement with said internally threaded longitudinal opening of said ejector member, said longitudinally extending externally threaded member further engaging with the internally threaded member of the second component;

whereby rotation of said pressure inserter member in a first direction will draw said longitudinally extending externally threaded member into said internally threaded member of the second component and cause said head portion to push the first component towards the second component; and whereby rotation of said pressure inserter member in a second direction will withdraw said longitudinally extending externally threaded member from said internally threaded member of the second component and cause said ejector portion to push the first component away from the second component.

10. The high pressure jackscrew connector in accordance with claim 9, further including a compression spring member positioned between said first portion of said ejector member and said head member of said pressure inserter member.

11. The high pressure jackscrew connector in accordance with claim 10, wherein said compression spring member is a coiled compression spring.

12. The high pressure jackscrew connector in accordance with claim 10, wherein said head member of said pressure inserter member has a downwardly projecting flange portion having a larger diameter than said compression spring member to cover said compression spring member when said pressure inserter member is engaged with said ejector member.

13. The high pressure jackscrew connector in accordance with claim 12, wherein said means for attaching said panel mount member to the first component is a swage flange.

14. The high pressure jackscrew connector in accordance with claim 13, wherein said head member of said pressure inserter member has a knurled outer diameter to facilitate rotation of said pressure inserter member by hand.

15. The high pressure jackscrew connector in accordance with claim 14, wherein said head member of said pressure inserter member has a rotation drive configuration to facilitate rotation of said pressure inserter member by a drive tool.

16. The high pressure jackscrew connector in accordance with claim 15, further including an inner washer positioned between said panel mount member and said outwardly extending portion of said ejector member.

17. The high pressure jackscrew connector in accordance with claim 16, further including an outer washer positioned between said panel mount member and said compression spring member.

18. A method of removably attaching a first component to a second component having an internally threaded member using a high pressure jackscrew connector, comprising the steps of:

- placing an ejector member having a longitudinally extending internally threaded opening and an outwardly extending portion in a panel mount member, said panel mount member having a first portion, a second portion and a longitudinal opening, said first portion having a smaller diameter than said second portion;
- attaching said second portion of said panel mount member on the first component, said first portion of said panel mount member and the first component prohibiting removal of said ejector member from said panel mount member;
- inserting a pressure inserter member having a head member and a longitudinally extending externally threaded member into said longitudinal opening of said panel mount member, said longitudinally extending externally threaded member having a length greater than the length of said longitudinal opening of said panel mount member;
- inserting said longitudinally extending externally threaded member of said pressure inserter member into said internally threaded opening of said ejector member and the internally threaded opening of the second component;
- rotating said pressure inserter member in a first direction to further engage said longitudinally extending externally threaded member into said internally threaded opening of said ejector member to pull said ejector member into a fixed engagement with said longitudinally extending externally threaded member within said longitudinal opening of said panel mount member;
- further rotating said pressure inserter member in said first direction to draw said longitudinally extending externally threaded member into said internally threaded member of the second component and cause said head portion to push the first component towards the second component; and
- rotating said pressure inserter member in a second direction to withdraw said longitudinally extending externally threaded member from said internally threaded member of the second component and cause said ejector portion to push the first component away from the second component.

19. The method of removably attaching a first component to a second component having an internally threaded member using a high pressure jackscrew connector in accordance with claim 18, wherein said second portion of said panel mount member includes a swage flange, and said step of attaching said second portion of said panel mount member on the first component consists of first making an opening in the first component and then attaching said panel mount member on the first component by swaging said swage flange in said opening.

20. The method of removably attaching a first component to a second component having an internally threaded member using a high pressure jackscrew connector in accordance with claim 18, wherein said head member of said pressure inserter member has a knurled surface on its outside diameter and said step of rotating said pressure inserter member to further engage said longitudinally extending externally threaded member into said internally threaded opening of said ejector member and into the internally threaded opening in the second component to pull said ejector member towards said head member of said pressure inserter member and to push the first component towards the second component consists of manually rotating said knurled outer diameter of said head member of said pressure inserter member by hand.

21. The method of removably attaching a first component to a second component having an internally threaded member using a high pressure jackscrew connector in accordance with claim 18, wherein said head member of said longitudinally extending externally threaded member has a rotation drive configuration and said step of rotating said pressure inserter member to further engage said longitudinally extending externally threaded member into said internally threaded opening of said ejector member and into the internally threaded opening in the second component to pull said ejector member towards said head member of said pressure inserter member and to push the first component towards the second component consists of rotating said head member of said pressure inserter member by engagement of said rotation drive configuration with a rotation driver tool.

* * * * *